United States Patent [19]
Baltus et al.

[11] Patent Number: 6,060,968
[45] Date of Patent: *May 9, 2000

[54] DEVICE WITH CIRCUIT ELEMENT AND TRANSMISSION LINE FORMED BY A DIELECTRIC BETWEEN FACING CONDUCTOR STRIPS

[75] Inventors: Petrus G. M. Baltus; Ronald Dekker; Lukas Leijten, all of Eindhoven, Netherlands

[73] Assignee: U.S. Philips Corporation, New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/937,963

[22] Filed: Sep. 25, 1997

[30] Foreign Application Priority Data

Sep. 27, 1996 [EP] European Pat. Off. .............. 96202711

[51] Int. Cl.[7] .............................. H01P 3/08; H01P 7/08; H01L 23/52
[52] U.S. Cl. ........................... 333/247; 333/33; 333/219; 257/664; 257/778
[58] Field of Search ..................................... 333/204, 219, 333/246, 247, 33; 257/698, 728, 778, 664

[56] References Cited

U.S. PATENT DOCUMENTS

| | | | |
|---|---|---|---|
| 4,916,417 | 4/1990 | Ishikawa et al. ........................ | 333/204 |
| 5,087,896 | 2/1992 | Wen et al. ............................ | 333/246 X |
| 5,138,436 | 8/1992 | Koepf .................................. | 333/247 X |
| 5,510,758 | 4/1996 | Fujita et al. ............................. | 333/247 |
| 5,552,752 | 9/1996 | Sturdivant et al. ................. | 333/246 X |
| 5,600,180 | 2/1997 | Kusaka et al. ...................... | 257/698 X |
| 5,621,366 | 4/1997 | Gu et al. .............................. | 333/219 X |

FOREIGN PATENT DOCUMENTS

| | | |
|---|---|---|
| 0474393A2 | 3/1992 | European Pat. Off. . |
| 0592002A2 | 4/1994 | European Pat. Off. . |
| 59-31042 | 4/1984 | Japan ..................................... 333/247 |

OTHER PUBLICATIONS

"Microwave Engineering: Passive Circuits", by P.A. Rizzi, Prentice Hall Intl . . . Inc., 1988, Ch. 5.3, Strip–Type Transmission Lines, pp. 190–200.

"Modern Transmission Line Theory and Applications", by L.N. Dworsky, John Wiley & Sons, 1979, Ch. 1.1: The Transmission Line: A Definition, pp. 1–2.

*Primary Examiner*—Robert Pascal
*Assistant Examiner*—Barbara Summons

[57] ABSTRACT

A device for processing electromagnetic waves in the microwave range, with a body provided with a circuit element which is electrically connected to a strip-type transmission line which comprises conductor tracks, said body being mechanically connected to an insulating substrate via contact bodies. The transmission line is formed by conductor tracks which lie on mutually facing surfaces of the body and the insulating substrate, respectively. The transmission line in the device is present between the body and the insulating substrate, the contact bodies providing a separation between the conductor tracks. Thus, it is not necessary then to use a second side of the body remote from the insulating substrate for the manufacture of transmission lines.

7 Claims, 1 Drawing Sheet

DEVICE WITH CIRCUIT ELEMENT AND TRANSMISSION LINE FORMED BY A DIELECTRIC BETWEEN FACING CONDUCTOR STRIPS

BACKGROUND OF THE INVENTION

The invention relates to a device for processing electromagnetic waves in the microwave region with a body provided with a circuit element which is electrically connected to a strip-type transmission line which comprises conductor tracks, said body being mechanically connected to an insulating substrate via contact bodies.

An active switching element, such as a transistor or diode, is combined with a passive component, i.e. a strip-type transmission line, in the device. The device is particularly designed for frequencies in the microwave range, i.e. frequencies between 300 MHz and 300 GHz. A strip-type transmission line is here understood to comprise two conductor tracks running in parallel and mutually separated by an insulating dielectric. The conductor tracks in the transmission line have a length which is at least a few percents of the wavelength of the highest electromagnetic wave to be used in the device. The conductor tracks may be symmetrical (stripline) as well as asymmetrical (microstrip). More details on transmission lines can be found in P. A. Rizzi: "Microwave Engineering: Passive Circuits", Prentice Hall International Inc., 1988, Ch. 5.3 strip-type transmission lines, p. 190 and L. N. Dworsky: "Modern Transmission Line Theory and Applications", John Wiley & Sons, 1979, Ch 1.1: The Transmission Line: A Definition, p. 1.

A device of the kind mentioned in the opening paragraph is known from European Patent Application no. 592002. The known device comprises a semiconductor body provided with conductor tracks and active circuit elements such as transistors or diodes. The conductor tracks on the semiconductor body are connected to conductor tracks on a first surface of an insulating, plate-shaped substrate facing the semiconductor body by means of conductive contact bodies or "bumps". The conductor tracks on this first surface are connected to conductor tracks on a second surface of the insulating substrate facing away from the semiconductor body by means of lead-throughs extending from the first surface to the second surface, the so-called vias. The conductor tracks on this second surface form passive elements such as transmission lines. The active circuit elements are accordingly connected to transmission lines on the second surface of the insulated substrate.

The known device described has the disadvantage that lead-throughs (vias) through the insulating substrate are necessary for connecting the transmission lines to a circuit element in the semiconductor body.

SUMMARY OF THE INVENTION

The invention has for its object inter alia to counteract the above disadvantage.

According to the invention, the device is for this purpose, characterized in that the transmission line is formed by conductor tracks which lie on mutually facing surfaces of the body and the insulating substrate. One of the two conductor tracks forming the transmission line lies accordingly on the body and the other one on the insulating substrate. It is not necessary in the device according to the invention to use a second side of the insulating substrate facing away from the body for providing transmission lines. The device is much more compact as a result of this.

The interspacing between the two conductor tracks forming the transmission line is defined by the height of the contact bodies between the body and the insulating substrate. The conductor track on the body may be directly connected to, for example, an electrode of the circuit element. The conductor track on the insulating substrate may be connected through a contact body to, for example, another electrode of the circuit element or to other circuit elements or passive components. It is not necessary in the device according to the invention to manufacture vias to a second side of the insulating substrate. The invention is based on the recognition that the distance between the body and the insulating substrate as obtained by means of the contact bodies and the dimensions of the body and the insulating substrate render possible a high-quality transmission line between the body and the insulating substrate.

Preferably, the device according to the invention is characterized in that the conductor tracks forming the transmission line are present in their entirety between the body and the substrate. It is achieved thereby that especially the conductor track on the insulating substrate does not extend further without this conductor track being coupled to the conductor track on the body. A single continuing conductor track would act as an antenna during operation, radiating electromagnetic waves and causing signal losses or interference.

The transmission line may be designed for forming an electrical connection between points on the body or on the substrate. An additional advantage is obtained when the transmission line forms a resonator or transformer. When the transmission line is used as a resonator, the conductor tracks are connected to one side of the transmission line, for example by means of conductive contact bodies at the circuit element. A short-circuit, an open end, or a fixed impedance will be present at some distance from the connections in that case. The transmission line then acts as a resonator or resonant cavity tuned to a certain frequency during operation, the length of the transmission line defining the, tuning frequency. When used as a transformer, for example, the conductor track on the body, is used as a primary winding of the transformer and the conductor track on the insulated substrate as a secondary winding of the transformer. Obviously, the reverse is also possible, the semiconductor track on the body forming the secondary winding and the conductor track on the insulating substrate the primary winding.

Preferably, the conductive contact bodies have a thickness greater than 40 $\mu$m. The losses occurring in the transmission line during operation are inversely proportional to the distance between the conductor tracks of the transmission line. Given a thickness of the bumps greater than 40 $\mu$m, the conductor tracks have an interspacing which renders the transmission line highly suitable for so-called low-power applications, because the losses in transmission line are comparatively low then in the microwave range.

Preferably, the body is attached to the substrate by means of a glue having a dielectric loss factor tg$\Delta$ of less than or equal to 0.005. The body is thus connected to the insulating substrate in a simple manner, while the electrical properties of the device remain comparatively good.

The insulating substrate may be, for example, a ceramic substrate manufactured from, for example, alumina, or a printed circuit board. Preferably, the device according to the invention comprises a glass substrate as the insulating substrate. Such a substrate has the advantage that it is possible to look through the glass substrate during the process of mounting the body to the glass substrate. Alignment of the conductor tracks on the body with those on the glass substrate is simple then.

BRIEF DESCRIPTION OF THE DRAWINGS

The invention will be explained in more detail below by way of example with reference to drawings, in which.

The Figures are purely diagrammatic and not drawn true to scale. Corresponding parts have generally been given the same reference numerals in the Figures.

DETAILED DESCRIPTION

Figure 1:
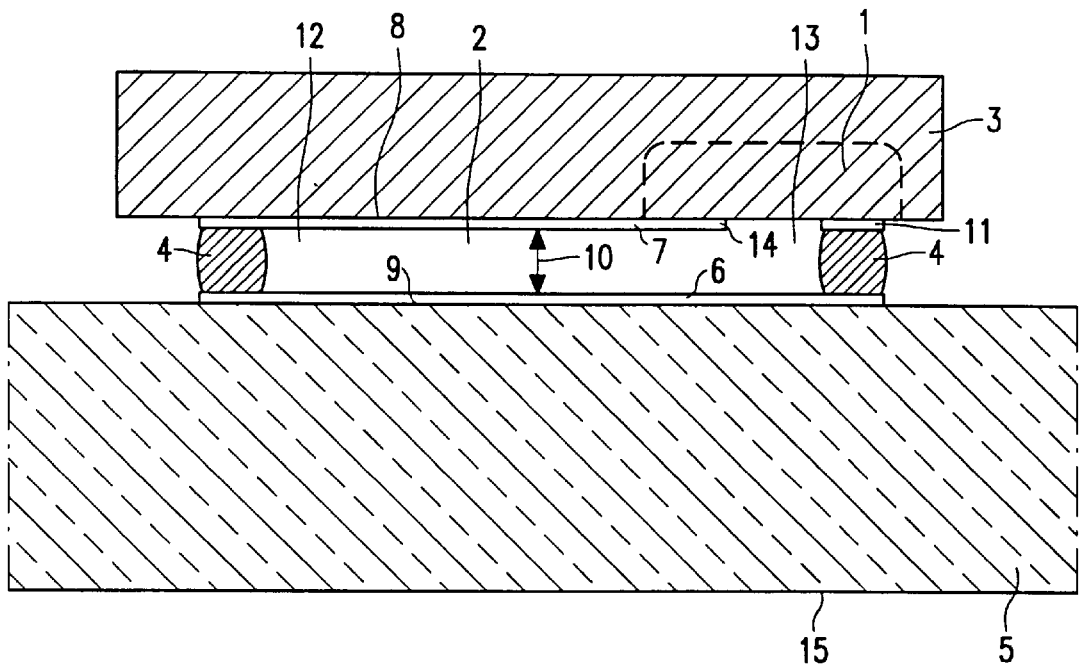
FIG. 1 shows a first embodiment where a circuit element is connected to a transmission line which acts as a resonator.

FIG. 1 shows a device with a circuit element 1 connected to a strip-type transmission line 2 for processing electromagnetic waves in the microwave range. The transmission line 2 comprises two parallel conductor tracks 6, 7 which are mutually separated by a dielectric. The device is provided with a body 3 comprising the circuit element 1. The body 3 in this example is manufactured from silicon. A so-called active circuit element such as, for example, a bipolar or MOS transistor is provided as the circuit element 1 in the body 3 in a standard manner (circuit element 1 is not drawn, its circumference is merely indicated with a broken line). The circuit element has connection points 11, 14, for example a base and emitter of a bipolar transistor. The connection points 11, 14 are each provided with a layer 7 of a conductive material, in this example aluminum with a width of 200 μm and a thickness of 3 μm. A gold contact body 4, a so-called bump, is provided on the layer of conductive material of the connection point 11. The circuit element 1 is connected to conductor tracks 6 on an insulating substrate 5 by means of the connection point 11. Said conductor tracks 6 are manufactured from gold and have a thickness of 5 μm and a width of 200 μm.

According to the invention, the transmission line 2 is formed by conductor tracks 6, 7 which lie on mutually facing surfaces 8, 9 of the body 3 and the insulating substrate 5, respectively. In other words, one of the two conductor tracks 6, 7 forming the transmission line, i.e. track 7 lies on the body 3, and the other one, i.e. track 6 on the insulating substrate 5. The connection point 14 of the circuit element 1 is connected to the conductor track 6 on the insulating substrate 5 via the conductive layer 7 and the conductive contact body 4. The interspacing 10 between the two conductor tracks 6, 7 forming the transmission line 2 is defined by the height of the contact bodies 4 present between the body 3 and the insulating substrate 5. It is not necessary in a device according to the invention to use a second side 15 of the body 3 facing away from the insulating substrate 5 for the manufacture of transmission lines 2. This renders the device comparatively compact.

In the embodiments, the conductor tracks 6, 7 forming the transmission line 2 are present in their entirety between the body 3 and the substrate 5. The conductor track 6 on the insulating substrate 5 thus does not extend to outside the body 3. One continuing conductor track 6 without an accompanying conductor track 7 on the body 3 would function as an antenna during operation, radiating electromagnetic waves, which would cause signal losses or interference.

The transmission line 2 may be constructed so as to form a standard electrical connection between points on the body 3 or on the insulating substrate 5. It is thus possible, for example, that the connection point 11 of the circuit element is connected via the conductive contact body 4 to a first conductor track 6 on the insulating substrate 5, said conductor track 6 being connected to a second circuit element in the body 3 via a conductive contact body 4. The connection point 14 in that case is connected to the second circuit element via conductor track 7. The electrical connection between the first and second circuit elements is formed by a transmission line according to the invention in that case.

FIG. 1 shows an embodiment in which the transmission line 2 forms a resonator. In this example the conductor track 6 on the insulating substrate 5 is connected to connection point 11 of the circuit element 1 via contact body 4. Connection point 14 of the circuit element 1 is connected to conductor track 7 on the semiconductor substrate 3. The conductor tracks 6, 7 in this example are short-circuited at one side 12 by means of a contact body 4. The short-circuit at side 12 of the transmission line is present at some distance from the connection points 11, 14. The transmission line 2 then acts as a resonator or resonant cavity tuned to a certain frequency during operation, a length between connection points 11, 14 and the short-circuit 12 defining this tuning frequency. A so-called ¼λ resonator which is of practical use for frequencies of approximately 6 GHz is obtained in this example in that conductor tracks of a length of approximately 4 mm are provided on the body 3 and on the insulating substrate 5. The height of the contact body 4, and accordingly the distance between the conductor track 7 on the body 3 and the conductor track 6 on the insulating substrate 5, is 50 μm. An epoxy glue, also called underfill, with a dielectric loss factor of 0.005 and a dielectric constant of approximately 3 is present between the body 3 and the substrate 5. The transmission line 2 is highly suitable for use as a resonator in that case. The quality factor of such a resonator is approximately 50. The resonator is highly suitable for so-called low-power applications.

Figure 2:
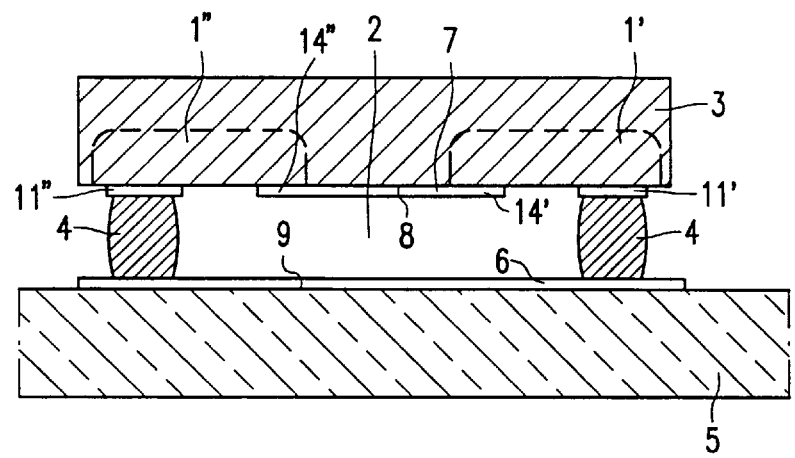
FIG. 2 shows a second embodiment in which a circuit element is connected to a transmission line which acts as a transformer.

FIG. 2 shows a second embodiment, in which the transmission line 2 is used as a transformer. In this example the conductor track 7 on the body 3 between connection points 14' and 14" is used as a primary winding of the transformer, and the conductor track 6 on the insulating substrate 5 between connection points 11' and 11" as a secondary winding of the transformer. The conductor track 6 on the body 3 is manufactured from aluminum with a thickness of 3 μm, a width of 50 μm, and a length of 3 mm. The conductor track 7 is made from gold with a thickness of 5 μm, a width of 200 μm, and a length of 4 mm. The contact bodies 4 are made from gold and have a thickness of 50 μm. The connection points 11, 14 in this example are connected to circuit elements 1' and 1" which form part of electronic circuits. The transmission line in the example of FIG. 2 provides a transformation of 1:1.3. The impedance of the transformer between the connection points 14' and 14" is 75 Ω and between the points 11' and 11" 97.5 Ω.

The device according to the invention may be manufactured by standard techniques. More details on standard techniques for the manufacture of semiconductor devices can be found in handbooks such as S. M. Sze: "VLSI Technology", Mc-Graw-Hill Book Company and S. Wolf: "Silicon Processing for the VLSI Era", vol. 1, 2, Lattice Press. The body 3 is made from a known material such as, for example, silicon or GaAs. One or several circuit elements 1 are formed in known manner in this body 3, for example, bipolar or MOS field effect transistors, diodes, thyristors, or triacs. These circuit elements may form part of, for example, an electronic circuit such as an amplifier or a voltage-controlled oscillator. The body 3 may alternatively comprise a combination of a semiconductor body and an insulator, for example, such as used in thin film circuits. The circuit elements 1 in the body 3 are usually provided with connection points 11, 14 which comprise strongly doped contact regions on which respective conductor tracks 6, 7 are provide,d in known manner. Conductor tracks 7, 6 on the body and on the insulating substrate, and the conductive layer on the connection points 11, 14 are formed in known manner by photolithographic techniques and etching from, for example, aluminum, copper, lead-tin, or gold layers. The conductive contact bodies 4, also called bumps, are formed in known manner in that a comparatively thick conductive layer of, for example, lead-tin or gold is provided, for example electrochemically, and in that this layer is patterned. The layer mail also be provided by an alternative method, by means of a solder jet or by a mechanical method. In the latter case, for example, a globule is formed at a gold wire having a diameter of 40 $\mu$m in a sparking process. This globule is connected to a conductor track at a connection point such as 11 or to a conductor track 6, 7, whereupon the gold wire is pulled off the globule. It is possible in this manner to manufacture contact bodies 4 of different dimensions through a variation in the wire thickness. It is also possible to put several contact bodies 4 one on top of the other. It is possible to provide the contact bodies 4 on the body 3 or on the insulating substrate 5. In the present example, mechanically manufactured gold contact bodies 4 are used which are attached to the body 3. The insulating substrate 5 may be, for example, a printed circuit board or a ceramic substrate made from, for example, alumina. It is also possible to use a semiconducting substrate which is provided with a sufficiently thick insulating layer. In the present embodiments, a glass substrate is used as the insulating substrate 5. The body 3 with the contact bodies 4 is subsequently applied to the insulating substrate 5. This is possible in various ways. Thus, for example, conductor tracks 6, 7 may be provided with a solderable layer, for example approximately 2 $\mu$m thick, or the conductor tracks may themselves consist of a solderable material. The conductive contact bodies 4, which are attached at one side to a conductor track 7, are then fixed to the conductor track 6 by means of soldering. In the present examples, an epoxy glue (underfill) is provided between the body and the insulating substrate. The body 3 is then pressed onto the substrate 5 while this glue is curing. A good electrical contact between the contact bodies 4 and the conductor tracks is obtained after curing owing to shrinkage of the glue during curing. A pressure contact is formed thereby between the contact body and the conductor track. It is not necessary to use a solder layer in this case. The glue layer is present between the conductor tracks 6 and 7. Preferably, the body is connected to the substrate by means of a glue having a dielectric loss factor tg$\Delta$ of less than or equal to 0.005. The body is connected to the insulating substrate in a simple manner then, while the electrical properties of the device remain comparatively good. If bumps made of lead-tin (solder) are used, flowing-out of the solder bump can be restricted by means of a patterned resist layer and the interspacing 10 between the conductors 6 and 7 may thus be defined.

The use of a glass substrate 5 has the advantage that it is possible to look through the glass substrate 5 during mounting of the body 3 to the glass substrate 5. An alignment of the conductor tracks 7 on the body 3 with the conductor tracks 6 on the glass substrate 5 is simple then.

What is claimed is:

1. A device for processing electromagnetic waves in the microwave region with a body provided with a circuit element which is electrically connected to a strip-type transmission line including conductor tracks, the body being mechanically connected to an insulating substrate via contact bodies, wherein the transmission line is formed by a dielectric disposed between conductor tracks which lie on mutually facing surfaces of the body and of the insulating substrate, wherein one of the conductor tracks being disposed directly on the surface of the body.

2. A device as claimed in claim 1, wherein the conductor tracks forming the transmission line are present in their entirety between the body and the substrate.

3. A device as claimed in claim 1, wherein the conductive contact bodies have a thickness greater than 40 $\mu$m.

4. A device as claimed in claim 1, wherein the body is attached to the substrate by means of a glue having a dielectric loss factor tg$\Delta$ of less than or equal to 0.005.

5. A device as claimed in claim 1, wherein the insulating substrate comprises a glass substrate.

6. A device for processing electromagnetic waves in the microwave region with a body provided with a circuit element electrically connected to a strip-type transmission line including conductor tracks, the body being mechanically connected to an insulating substrate via contact bodies, wherein the transmission line is formed by conductor tracks disposed on mutually facing surfaces of the body and of the insulating substrate, wherein the transmission line forms a resonator.

7. A device for processing electromagnetic waves in the microwave region with a body provided with a circuit element electrically connected to a strip-type transmission line including conductor tracks, the body being mechanically connected to an insulating substrate via contact bodies, wherein the transmission line is formed by conductor tracks disposed on mutually facing surfaces of the body and of the insulating substrate, wherein the transmission line forms a transformer.

\* \* \* \* \*